(12) United States Patent
Wang

(10) Patent No.: US 8,774,365 B2
(45) Date of Patent: Jul. 8, 2014

(54) THERMAL COMPENSATION SIGNAL FOR HIGH VOLTAGE SENSING

(75) Inventor: Dongbing Wang, Lathrop, CA (US)

(73) Assignee: Moxtek, Inc., Orem, UT (US)

( * ) Notice: Subject to any disclaimer, the term of this patent is extended or adjusted under 35 U.S.C. 154(b) by 264 days.

(21) Appl. No.: 13/465,195

(22) Filed: May 7, 2012

(65) Prior Publication Data
US 2013/0121472 A1 May 16, 2013

Related U.S. Application Data

(60) Provisional application No. 61/501,394, filed on Jun. 27, 2011.

(51) Int. Cl.
*H05G 1/32* (2006.01)

(52) U.S. Cl.
USPC .......................... 378/111; 324/76.11; 324/98

(58) Field of Classification Search
USPC .................. 378/111, 112, 207; 324/76.11, 98
See application file for complete search history.

(56) References Cited

U.S. PATENT DOCUMENTS

| | | | | |
|---|---|---|---|---|
| 3,913,392 | A * | 10/1975 | Nagase et al. | 73/766 |
| 5,184,520 | A * | 2/1993 | Naito | 73/862.623 |
| 2007/0181554 | A1* | 8/2007 | Nakano et al. | 219/216 |
| 2008/0123815 | A1* | 5/2008 | Feda | 378/112 |
| 2010/0134180 | A1* | 6/2010 | Smith et al. | 327/539 |
| 2010/0289500 | A1* | 11/2010 | Itoh et al. | 324/537 |

* cited by examiner

*Primary Examiner* — Glen Kao
(74) *Attorney, Agent, or Firm* — Thorpe North & Western LLP

(57) ABSTRACT

A high voltage sensing circuit with temperature compensation comprises a first series of resistors in parallel with a second series of resistors. The first series includes a material with a different temperature coefficient of resistance than in the second series. A voltage measurement circuit calculates a high voltage by use of a voltage across a resistor in the first series and a voltage differential between the series.

20 Claims, 3 Drawing Sheets

THERMAL COMPENSATION SIGNAL FOR HIGH VOLTAGE SENSING

CLAIM OF PRIORITY

Priority is claimed to U.S. Provisional Patent Application Ser. No. 61/501,394, filed on Jun. 27, 2011; which is incorporated herein by reference in its entirety.

BACKGROUND

It can be difficult to directly sense very high voltages, such as voltages of many kilovolts. As shown in FIG. 3, a high voltage sensing circuit 30 can comprise resistors in series 11 to indirectly sense very high voltages. A first resistor r1, having a relatively small resistance R1, can be electrically connected in series 11 with a second resistor r2, having a relatively large resistance R2. The difference in resistances of the resistors can be very large. For example, the larger resistance R2 divided by the smaller resistance R1 can be about 1000.

The series 11 can be connected across a device 15 having a very high voltage differential, such that one end of the series 11 is connected to a lower voltage section of the device 15 and another end of the series 11 is connected to a higher voltage section. Either end 13 or 14 can be the lower voltage section and the opposing end can be the higher voltage section. The high and low voltage sections 13 and 14 can be separated by insulative material 17. The insulative material 17 can be air. The insulative material 17 can be an insulative tube, such as an x-ray tube.

Because of the small resistance R1 of the first resistor r1 in the series 11 compared to a sum of the resistances of the two resistors (R1+R2), the voltage V1 across the first resistor r1 can be relatively small and can be measured more easily than the relatively large voltage $V_T$ across the entire device 15. The voltage V1 across the first resistor r1 can be used to calculate the voltage $V_T$ across the device 15 by the equation:

$$V_T = V1 * \frac{R1 + R2}{R1}.$$

The equation:

$$V_T = V1 * \frac{R1 + R2}{R1}$$

can provide an accurate indication of the voltage $V_T$ across the device 15 if the resistors r1 & r2 are maintained at the same temperature. In reality, each resistor can have a different temperature from the other resistor, and a single resistor can even have temperature differentials across the single resistor. Temperature changes can cause resistances of the resistors to change, and uneven temperature changes across the resistors, or of one resistor compared to another resistor, can result in an inaccurate indication of the voltage $V_T$ across the device.

This temperature dependence of the resistors can be shown by the equation: $R=R_{ref}[1+\alpha(T-T_{ref})]$ in which R is the resistance at temperature T, $R_{ref}$ is the resistance at a reference temperature $T_{ref}$, and $\alpha$ is a temperature coefficient of resistance for the resistive material.

The resistors can be surface mount, and for very large resistances, which are needed for sensing very large voltages, such as around tens of kilovolts, the surface mount resistor can be several centimeters long. If the sensing circuit 30 is used for sensing x-ray tube voltage, one end of the series 11 can be disposed near the x-ray tube cathode and can be heated by the cathode. The other end, farther from the cathode, may be heated less, thus resulting in substantial temperature differential across the series 11 of resistors. This temperature differential can result in an inaccurate indication of the actual tube voltage. The user of the x-ray tube can thus have a different x-ray output spectrum than desired or than expected based on the indication of the tube voltage.

It would be beneficial to be able to correct for inaccuracies, caused by temperature differentials of the resistors, in order to obtain a more accurate device voltage.

SUMMARY

It has been recognized that it would be advantageous to correct for inaccuracies, caused by temperature differentials of the resistors, in calculated device voltage. The present invention is directed to a high voltage sensing circuit with temperature compensation that satisfies this need.

In one embodiment, a high voltage sensing circuit with temperature compensation comprises high voltage sensing resistors and a voltage measurement circuit. The high voltage sensing resistors comprise a first resistor r1 having a first resistance R1, a second resistor r2 having a second resistance R2, a third resistor r3 having a third resistance R3, and a fourth resistor r4 having a fourth resistance R4.

The first resistor r1 and the second resistor r2 can be electrically connected in series, comprising a first series 11. The connection between the first resistor r1 and the second resistor r2 can be called a first connection C1. One end of the first series can be configured to be electrically connected to a high voltage and another end of the series can be configured to be electrically connected to a low voltage.

The third resistor r3 and the fourth resistor r4 can be electrically connected in series, comprising a second series 12. The connection between the third resistor r3 and the fourth resistor r4 can be called a second connection C2.

The first series 11 and the second series 12 can be electrically connected in parallel. The first series 11 can comprise a first resistive material that has a first temperature coefficient of resistance $\alpha 1$, the second series can comprise a second resistive material that has a second temperature coefficient of resistance $\alpha 2$. The first temperature coefficient of resistance $\alpha 1$ can be different from the second temperature coefficient of resistance $\alpha 2$ ($\alpha 1 \neq \alpha 2$).

The voltage measurement circuit can be configured to calculate a total voltage $V_T$ between the high voltage and the low voltage by determining a voltage differential across the first resistor, called a first voltage (V1), determining a voltage between the first connection and the second connection, called a differential voltage ($V_d$), and using the first voltage and the differential voltage to calculate the total voltage.

DEFINITIONS

Figure 1:
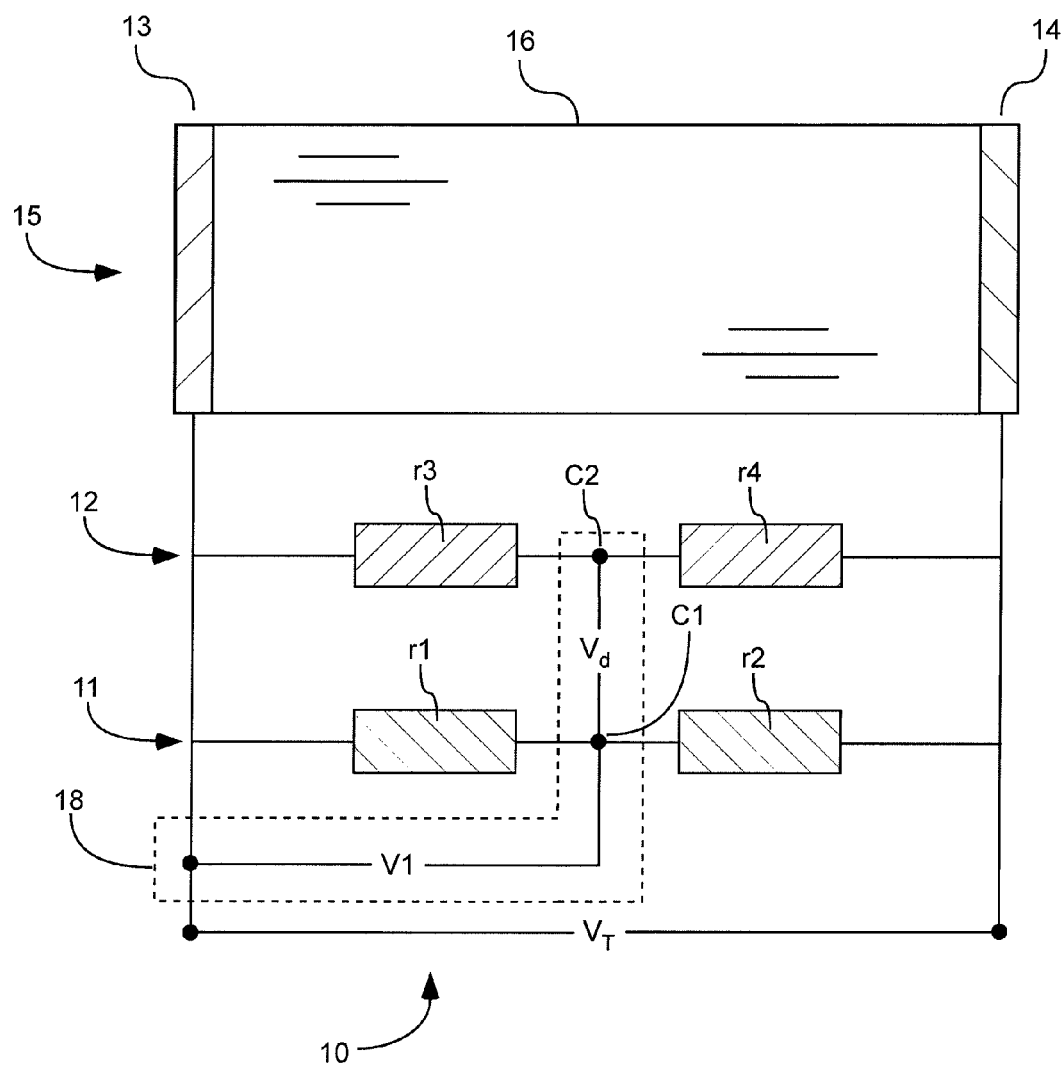
FIG. 1 is a schematic of a high voltage sensing circuit, with temperature compensation, and a high voltage device, in accordance with an embodiment of the present invention.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

DETAILED DESCRIPTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

As illustrated in FIG. 1, a high voltage sensing circuit with temperature compensation 10 is shown comprising high voltage sensing resistors r1-4 and a voltage measurement circuit 18.

The high voltage sensing resistors comprise a first resistor r1 having a first resistance R1, a second resistor r2 having a second resistance R2, a third resistor r3 having a third resistance R3, and a fourth resistor r4 having a fourth resistance R4.

The first resistor r1 and the second resistor r2 can be electrically connected in series, comprising a first series 11. The connection between the first resistor r1 and the second resistor r2 can be called a first connection C1. One end of the first series 11 can be configured to be electrically connected to a high voltage and another end of the series can be configured to be electrically connected to a low voltage.

The third resistor r3 and the fourth resistor r4 can be electrically connected in series, comprising a second series 12. The connection between the third resistor r3 and the fourth resistor r4 can be called a second connection C2.

The first series 11 and the second series 12 can be electrically connected in parallel. The first series 11 can comprise a first resistive material that has a first temperature coefficient of resistance $\alpha 1$, the second series can comprise a second resistive material that has a second temperature coefficient of resistance $\alpha 2$, and the first temperature coefficient of resistance $\alpha 1$ can be different from the second temperature coefficient of resistance $\alpha 2$ ($\alpha 1 \neq \alpha 2$).

The voltage measurement circuit can be configured to calculate a total voltage $V_T$ between the high voltage and the low voltage by determining a voltage differential across the first resistor, called a first voltage V1, determining a voltage between the first connection and the second connection, called a differential voltage $V_d$, and using the first voltage V1 and the differential voltage $V_d$ to calculate the total voltage. The resistors r1-4 described herein can each be a single component, or can be a combination of multiple components, including resistive features. Thus, the first voltage V1 can be a voltage drop across a single resistor, or can be a voltage drop across multiple resistors or resistors plus other components.

In one embodiment, the total voltage $V_T$ can be at least at least 1000 volts. In another embodiment, the total voltage $V_T$ can be at least at least 4000 volts. In another embodiment, the total voltage $V_T$ can be at least at least 10,000 volts.

In one embodiment, the high voltage sensing circuit can be attached to a high voltage device 15 having high and low voltage ends 13 and 14 electrically separated by insulative material 16. In FIG. 1, one end 13 or 14 can be the high voltage end and the other end 14 or 13 can be the low voltage end.

In one embodiment, the high voltage sensing circuit 10 can be used to determine a voltage between a cathode and an anode of an x-ray source 15. End 13 in FIG. 1 can be the cathode or the anode and the other end 14 can be the other of these two components. The insulative material 16 can be a hollow insulative cylinder of an x-ray tube.

In one embodiment, the voltage measurement circuit 10 can calculate the total voltage $V_T$ with improved accuracy by including a temperature compensation factor k. The total voltage $V_T$ can be calculated by:

$$V_T = V1 * \frac{R1 + R2}{R1} + k * V_d$$

in which k is a factor used to compensate for temperature differentials between the first and second resistors.

The factor k can be determined by recording voltages $V_T$, V1, and $V_d$ at different temperature differentials between the first and second resistors and by the equation:

$$V_T = V1 * \frac{R1 + R2}{R1} + k * V_d.$$

Factor k can be determined by maintaining the total voltage $V_T$ constant and recording the values of the first voltage V1 and the differential voltage $V_d$ at different temperatures, then using this information to calculate factor k.

In one embodiment, temperature coefficients of resistance $\alpha$ and resistances R of the resistors r1-4 can be selected such that:

$$\frac{R1 + R2}{R1} = \frac{R3 + R4}{R3}$$

when there is substantially no temperature differential between one end of the first series and an opposing end of the first series. The equation $R = R_{ref}[1 + \alpha(T - T_{ref})]$, in which R is resistance at temperature T, $R_{ref}$ is resistance at a reference temperature $T_{ref}$, and $\alpha$ is a temperature coefficient of resistance for the resistive material, can be used for finding desired resistor values. Due to a different temperature coefficient of resistance $\alpha 1$ of the first series 11 of resistors r1-2 compared to the temperature coefficient of resistance $\alpha 2$ of the second series 12 of resistors r3-4, the relationship $$\frac{R1 + R2}{R1} = \frac{R3 + R4}{R3}$$

will not be true when there is a temperature difference from one end of the first series 11 to an opposing end, but rather the following will be true:

$$\frac{R1+R2}{R1} \neq \frac{R3+R4}{R3} \text{ or } \left|\frac{R1+R2}{R1} - \frac{R3+R4}{R3}\right| > 0.$$

In one embodiment, temperature coefficients of resistance α and resistances R1-4 of the resistors r1-4 in the high voltage sensing circuit 10 can be selected such that $$\left|\frac{R1+R2}{R1} - \frac{R3+R4}{R3}\right| < 1$$

when there is less than one degree Celsius temperature differential between one end of the first series and an opposing end of the first series and $$\left|\frac{R1+R2}{R1} - \frac{R3+R4}{R3}\right| > 10$$

when there is a temperature differential of at least two degrees Celsius between one end of the first series and an opposing end of the first series.

In another embodiment, the resistances R and temperature coefficients of resistance a of the resistors can be selected such that $$\left|\frac{R1+R2}{R1} - \frac{R3+R4}{R3}\right| = X$$

when there is no temperature differential between one end of the first series and an opposing end of the first series, $$\left|\frac{R1+R2}{R1} - R3 + R4R3 = Y\right|$$

when there is 1 degree Celsius temperature differential between one end of the first series and an opposing end of the first series, and |X−Y|>0.00000025. |X−Y| represents the strength of signal, thus, in this embodiment the signal is at least 0.00000025. In another embodiment, the strength of signal, |X−Y|, is at least 0.000005, or |X−Y|>0.000005. In another embodiment, the strength of signal, |X−Y|, is at least 0.00005, or |X−Y|>0.00005.

The temperature coefficients of resistance α1 and α2 can be selected to provide the desired strength of signal. An absolute value of the temperature coefficient of resistance α1 of the first resistive material divided by the temperature coefficient of resistance α2 of the second resistive material can be greater than $$1.03 \left(\left|\frac{\alpha 1}{\alpha 2}\right| > 1.03\right)$$

in one embodiment, greater than $$1.3 \left(\left|\frac{\alpha 1}{\alpha 2}\right| > 1.3\right)$$

in another embodiment, or greater than $$10 \left(\left|\frac{\alpha 1}{\alpha 2}\right| > 10\right)$$

in another embodiment. An absolute value of the temperature coefficient of resistance α2 of the second resistive material divided by the temperature coefficient of resistance α1 of the first resistive material can be greater than $$1.03 \left(\left|\frac{\alpha 2}{\alpha 1}\right| > 1.03\right)$$

in one embodiment, greater than $$1.3 \left(\left|\frac{\alpha 2}{\alpha 1}\right| > 1.3\right)$$

in another embodiment, or greater than $$10 \left(\left|\frac{\alpha 2}{\alpha 1}\right| > 10\right)$$

in another embodiment. In other words, a larger of the first or second temperature coefficient of resistance divided by a smaller of the first or second temperature coefficient of resistance can have an absolute value that is greater than 1.03 in one embodiment, greater than 1.3 in another embodiment, or greater than 10 in another embodiment. For example, if the first resistor has a temperature coefficient of resistance α1 of 0.005866 and the second resistor has a temperature coefficient of resistance α2 of 0.004403, then $$\frac{\alpha 1}{\alpha 2} = 1.33.$$

Typically, the second resistor r2 has a much larger resistance R2 than a resistance R1 of the first resistor r1 in order to allow easier measurement of the voltage drop V1 across the first resistor r1. The second resistance R2 minus the first resistance R1 can be greater than 1000 ohms (R2−R1>1000 ohms) in one embodiment. The second resistance R2 divided by the first resistance R1 can be greater than 500 (R2/R1>500) in one embodiment or greater than 1000 (R2/R1>1000) in another embodiment. The second resistance R2 can be at least 10 mega ohms in one embodiment, at least 1 giga ohm in another embodiment, or at least 10 giga ohms in another embodiment.

Figure 2:
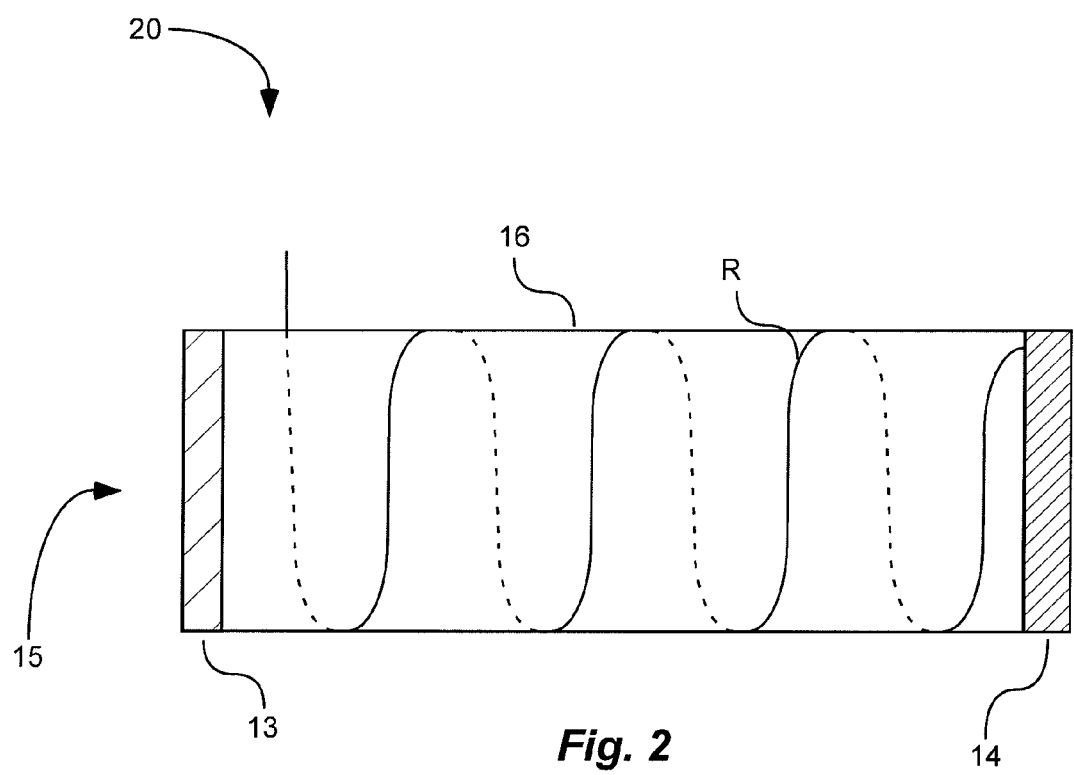
FIG. 2 is a schematic cross-sectional side view of at least one of the resistors in a high voltage sensing circuit disposed on a high voltage device, in accordance with an embodiment of the present invention.
Figure 3:
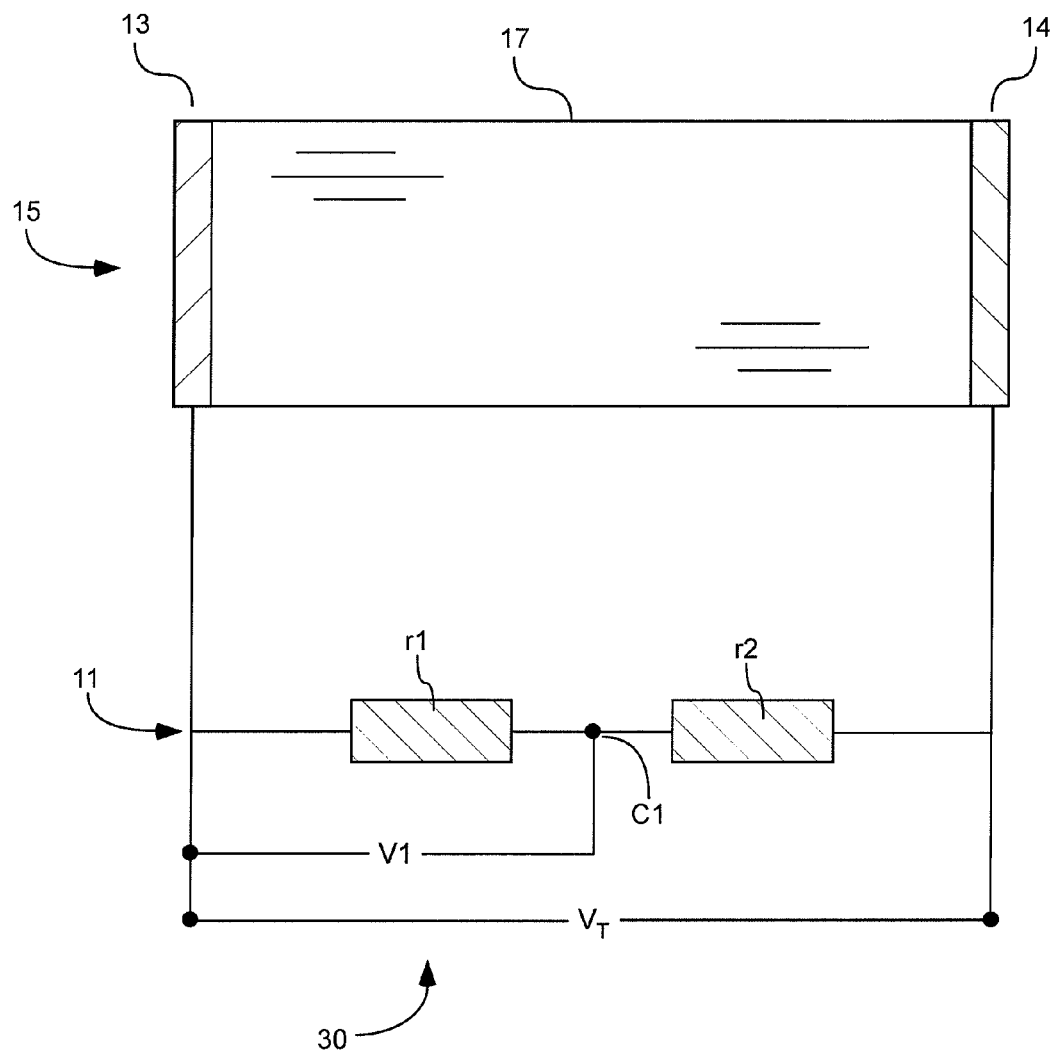
FIG. 3 is a schematic of a high voltage sensing circuit, and a high voltage device, in accordance with prior art.

In one embodiment, shown in FIG. 2, of one of the high voltage sensing circuits described herein, at least one of the high voltage sensing resistors R can be disposed on, or painted on, an insulative surface of a high voltage device 15, such as an x-ray tube, as described more fully in U.S. Patent Application No. 61/420,401, filed on Dec. 7, 2010; and 61/610,018, filed on Mar. 13, 2012; all of which are hereby incorporated herein by reference in their entirety.

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred embodiment(s) of the invention, it will be apparent to those of ordinary skill in the art that numerous modifications can be made without departing from the principles and concepts of the invention as set forth herein.

What is claimed is:

1. A high voltage sensing circuit, with temperature compensation, for an x-ray source, comprising:
   a. high voltage sensing resistors comprising:
      i. a first resistor having a first resistance (R1), a second resistor having a second resistance (R2), a third resistor having a third resistance (R3), and a fourth resistor having a fourth resistance (R4);
      ii. a first series comprising the first resistor and the second resistor electrically connected in series, the connection between the first resistor and the second resistor called a first connection, and having one end of the first series configured to be electrically connected to a cathode of the x-ray source and another end of the first series configured to be electrically connected to an anode of the x-ray source;
      iii. a second series comprising the third resistor and the fourth resistor electrically connected in series, the connection between the third resistor and the fourth resistor called a second connection;
      iv. the first series and the second series electrically connected in parallel;
      v. the first series comprising a first resistive material that has a first temperature coefficient of resistance, the second series comprising a second resistive material that has a second temperature coefficient of resistance, and the first temperature coefficient of resistance is different from the second temperature coefficient of resistance; and
   b. a voltage measurement circuit configured to calculate a total voltage ($V_T$) between the cathode and the anode of the x-ray source by:
      i. determining a voltage differential across the first resistor, called a first voltage (V1);
      ii. determining a voltage between the first connection and the second connection, called a differential voltage ($V_d$); and
      iii. using the first voltage and the differential voltage to calculate the total voltage.

2. The high voltage sensing circuit of claim 1, wherein the total voltage $V_T$ is calculated by:

$$V_T = V1 * \frac{R1 + R2}{R1} + k * V_d$$

in which k is a factor used to compensate for temperature differentials between the first and second resistors.

3. The high voltage sensing circuit of claim 2, wherein the factor k is determined by recording voltages $V_T$, V1, and $V_d$ at different temperature differentials between the first and second resistors and by the equation:

$$V_T = V1 * \frac{R1 + R2}{R1} + k * V_d.$$

4. The high voltage sensing circuit of claim 1, wherein the resistances and temperature coefficients of resistance of the resistors are selected such that:
   a.

$$\left| \frac{R1 + R2}{R1} - \frac{R3 + R4}{R3} \right| = X$$

when there is no temperature differential between one end of the first series and an opposing end of the first series;
   b.

$$\left| \frac{R1 + R2}{R1} - \frac{R3 + R4}{R3} \right| = Y$$

when there is 1 degree Celsius temperature differential between one end of the first series and an opposing end of the first series; and
   c. |X−Y|>0.00000025.

5. The high voltage sensing circuit of claim 1, wherein the resistances and temperature coefficients of resistance of the resistors are selected such that:
   a.

$$\left| \frac{R1 + R2}{R1} - \frac{R3 + R4}{R3} \right| = X$$

when there is no temperature differential between one end of the first series and an opposing end of the first series;
   b.

$$\left| \frac{R1 + R2}{R1} - \frac{R3 + R4}{R3} \right| = Y$$

when there is 1 degree Celsius temperature differential between one end of the first series and an opposing end of the first series; and
   c. |X−Y|>0.000003.

6. The high voltage sensing circuit of claim 1, wherein the resistances and temperature coefficients of resistance of the resistors are selected such that:
   a.

$$\frac{R1 + R2}{R1} = \frac{R3 + R4}{R3}$$

when there is substantially no temperature differential between one end of the first series and an opposing end of the first series; and
   b.

$$\left| \frac{R1 + R2}{R1} - \frac{R3 + R4}{R3} \right| > 0$$

when there is a temperature differential between one end of the first series and an opposing end of the first series.

7. The high voltage sensing circuit of claim 1, wherein the voltage measurement circuit calculates the total voltage with improved accuracy by including a temperature compensation factor based on the differential voltage.

8. The high voltage sensing circuit of claim 1, wherein the voltage measurement circuit is configured to calculate a total voltage of at least 4000 volts.

9. The high voltage sensing circuit of claim 1, wherein R2 minus R1 is greater than 1000 ohms.

10. The high voltage sensing circuit of claim 1, wherein R2 divided by R1 is greater than 500.

11. The high voltage sensing circuit of claim 1, wherein R2 is at least 10 mega ohms.

12. The high voltage sensing circuit of claim 1, wherein R2 is at least 1 giga ohm.

13. The high voltage sensing circuit of claim 1, wherein R2 is at least 10 giga ohms.

14. The high voltage sensing circuit of claim 1, wherein a larger of the first or second temperature coefficient of resistance divided by a smaller of the first or second temperature coefficient of resistance has an absolute value that is greater than 10.

15. The high voltage sensing circuit of claim 1, wherein a larger of the first or second temperature coefficient of resistance divided by a smaller of the first or second temperature coefficient of resistance has an absolute value that is greater than 1.3.

16. The high voltage sensing circuit of claim 1, wherein at least one of the high voltage sensing resistors is disposed on an x-ray tube of the x-ray source.

17. A high voltage sensing circuit with temperature compensation comprising:
  a. high voltage sensing resistors comprising:
    i. a first resistor having a first resistance (R1), a second resistor having a second resistance (R2), a third resistor having a third resistance (R3), and a fourth resistor having a fourth resistance (R4);
    ii. a first series comprising the first resistor and the second resistor electrically connected in series, the connection between the first resistor and the second resistor called a first connection, and having one end of the first series configured to be electrically connected to a high voltage and another end configured to be electrically connected to a low voltage;
    iii. a second series comprising the third resistor and the fourth resistor electrically connected in series, the connection between the third resistor and the fourth resistor called a second connection;
    iv. the first series and the second series electrically connected in parallel;
    v. the first series comprising a first resistive material that has a first temperature coefficient of resistance, the second series comprising a second resistive material that has a second temperature coefficient of resistance, and the first temperature coefficient of resistance is different from the second temperature coefficient of resistance; and
  b. a voltage measurement circuit configured to calculate a total voltage ($V_T$) of at least 1000 volts between the high voltage and the low voltage by:
    i. determining a voltage differential across the first resistor, called a first voltage (V1);
    ii. determining a voltage between the first connection and the second connection, called a differential voltage ($V_d$); and
    iii. using the first voltage V1 and the differential voltage $V_d$ to calculate the total voltage.

18. The high voltage sensing circuit of claim 17, wherein the voltage between the high voltage and the low voltage is calculated by:

$$V_T = V1 * \frac{R1 + R2}{R1} + k * V_d$$

in which k is a factor used to compensate for temperature differentials between the first and second resistors.

19. An x-ray source, comprising:
  a. an x-ray tube having a cathode and an anode attached to the tube, the cathode and the anode separated from each other by electrically insulative material;
  b. high voltage sensing resistors comprising:
    i. a first resistor having a first resistance (R1), a second resistor having a second resistance (R2), a third resistor having a third resistance (R3), and a fourth resistor having a fourth resistance (R4);
    ii. a first series comprising the first resistor and the second resistor electrically connected in series, the connection between the first resistor and the second resistor called a first connection, one end of the first series electrically connected to the cathode and another end electrically connected to the anode, R2 is at least 1 mega ohm, and R2 divided by R1 is greater than 100;
    iii. a second series comprising the third resistor and the fourth resistor electrically connected in series, the connection between the third resistor and the fourth resistor called a second connection;
    iv. the first series and the second series electrically connected in parallel;
    v. the first series comprising a first resistive material that has a first temperature coefficient of resistance, the second series comprising a second resistive material that has a second temperature coefficient of resistance, and the first temperature coefficient of resistance is different from the second temperature coefficient of resistance; and
  c. a voltage measurement circuit configured to determine a total voltage ($V_T$), of at least 4000 volts, between the cathode and the anode by:
    i. determining a voltage differential across the first resistor, called a first voltage (V1);
    ii. determining a voltage between the first connection and the second connection, called a differential voltage ($V_d$); and
    iii. using the first voltage V1 and the differential voltage $V_d$ to determine the total voltage $V_T$ by using the relationship:

$$V_T = V1 * \frac{R1 + R2}{R1} + k * V_d$$

in which k is a factor used to compensate for temperature differentials between the first and second resistors.

20. The high voltage sensing circuit of claim 19, wherein a larger of the first or second temperature coefficient of resistance divided by a smaller of the first or second temperature coefficient of resistance has an absolute value that is greater than 10.

* * * * *